United States Patent
Cho

(10) Patent No.: US 7,483,156 B2
(45) Date of Patent: Jan. 27, 2009

(54) METHOD FOR MEASURING OVERLAY AND OVERLAY MARK USED THEREFOR

(75) Inventor: Jeong-Hee Cho, Hwanseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 360 days.

(21) Appl. No.: 11/235,173

(22) Filed: Sep. 27, 2005

(65) Prior Publication Data
US 2006/0078808 A1 Apr. 13, 2006

(30) Foreign Application Priority Data
Oct. 7, 2004 (KR) .................. 10-2004-0079766

(51) Int. Cl.
*G01B 11/02* (2006.01)
(52) U.S. Cl. .................. 356/635; 356/636
(58) Field of Classification Search ......... 356/399–401, 356/634–637; 382/151; 250/548, 584; 430/5, 430/22, 30; 355/53, 55, 77; 257/797; 438/401, 438/16
See application file for complete search history.

(56) References Cited

U.S. PATENT DOCUMENTS

| 5,766,809 | A  * | 6/1998 | Bae ........................ 430/22 |
| 6,218,200 | B1 * | 4/2001 | Chen et al. ............... 438/14 |
| 6,266,144 | B1   | 7/2001 | Li |
| 6,357,131 | B1   | 3/2002 | Cheng et al. |
| 6,657,203 | B2   | 12/2003 | Koike |
| 7,099,010 | B2 * | 8/2006 | Schulz ..................... 356/401 |

* cited by examiner

Primary Examiner—Gregory J Toatley, Jr.
Assistant Examiner—Tri T Ton
(74) Attorney, Agent, or Firm—Volentine & Whitt, PLLC

(57) ABSTRACT

An overlay measurement method and related apparatus are provided in which overlay measurement data is calculated on the basis of distances measured in disparate manners in relation to whether the current process is an initial process or a subsequent process. Related overlay marks are also described.

15 Claims, 4 Drawing Sheets

METHOD FOR MEASURING OVERLAY AND OVERLAY MARK USED THEREFOR

CROSS-REFERENCE TO RELATED APPLICATION

This application claims the benefit of Korean Patent Application No. 10-2004-0079766, filed Oct. 7, 2004, the disclosure of which is hereby incorporated by reference in its entirety.

BACKGROUND OF THE INVENTION

1. Technical Field

Embodiments of the invention relate generally to a method for measuring overlay and use of an overlay mark. More particularly, the embodiments relate to an overlay measuring method adapted to calculate overlay data through the measurement of overlay upon implementing on a wafer an initial photolithography, and an overlay mark for use in the method.

2. Discussion of Related Art

The manufacture of semiconductor devices involves a complex sequence of individual fabrication processes. The overall complexity of this manufacturing sequence and the competitive nature of the semiconductor industry generally result in stringent demands being placed upon the accuracy of each constituent fabrication process. That is, commercial competitiveness demands high product yield, and high product yield demands great accuracy in the individual fabrication processes. As a result, methods and apparatuses adapted to detect, identify and measure process errors for each constituent fabrication process in the manufacturing sequence have been the subject of active study and refinement. Various photolithography processes are commonly included in the sequence of fabrication processes used to manufacture semiconductor devices. Photolithography processes are notoriously susceptible to changes in process conditions, e.g., temperature, humidity, mechanical vibrations induced by preceding processes, etc. Thus, numerous corrective methods and devices have been proposed to mitigate the effects of process condition variations in relation to photolithography processes.

One common problem associated with the accurate performance of a photolithographic process is the misalignment of a photoresist pattern. Photoresist patterns are commonly used to define circuit patterns on a semiconductor substrate.

Generally speaking a photoresist pattern is formed by a photolithographic process comprising several distinct steps including a coating process, an alignment and exposure process, a development process, and an overlay measurement. The coating process is usually performed by spinner. A stepper is typically used to first expose a photoresist layer to a patterned light source having a particular wavelength and then develop the exposed material layer. A scanner or a scanning electron spectroscopy apparatus are then used to perform the overlay measurement process.

As semiconductor devices become more highly integrated on ever larger wafers—thereby reducing design tolerances—and as the number of individual photolithography processes involved in the manufacture of a semiconductor device rises, the importance of alignment accuracy for the photoresist patterns in the various photolithography processes only increases. To prevent defects in the semiconductor device arising from misalignment, it is essential to verify with exceptional accuracy (e.g., optimized accuracy), the alignment of a photoresist pattern formed on a wafer being processed.

Conventional methods directed to the optimization of a overlay measurement are disclosed, for examples, in U.S. Pat. Nos. 5,696,835 and 6,357,131.

The conventional methods of overlay measurement generally include, first, forming a photoresist pattern (e.g., an alignment measurement pattern) on a wafer, and then measuring an overlapped position between the photoresist pattern and an underlying pattern layer (e.g., a reference pattern). Unfortunately, contemporary circuit patterns defined by the various pattern layers are so complex that a global overlap examination in not practical. Thus, special overlay marks are strategically incorporated within the pattern layers to indicate via sampled examination the state of pattern overlay. Overlay marks are often formed in relation to a scribe line near the outer edge of the area on the wafer in which the circuit pattern is formed.

Conventional overlay measurements are conducted in accordance with a defined number of exposure "shots" applied to a wafer, or the overall size of the wafer. Overlay measurements are made in relation to overlay and alignment marks on a global rather than local basis relative to the entire surface area of the wafer being processed.

Overlay data is conventionally obtained using a regression analysis for each overlay measurement taken with respect to an overlay mark formed on the wafer. The overlay data indicates degree(s) of distortion and/or rotation in the X and Y directions between the wafer and an optical reticle or mask defining the pattern light exposing the photoresist layer. For example, the deviations from ideal of the overlay measurement data may be classified into wafer related parameters and reticle related parameters. Wafer related parameter are generally related to positional errors that vary between individual shots due, for example, to poor stamping in reference to the center of the wafer. Reticle related parameters are generally related to maladjustments or omission of particular component(s) in the exposure device associated with the reticle. The resulting variations in magnification and/or focus of the exposing light through the reticle ultimately result in pattern errors.

The conventional overlay measurement device seeks to calculate correction factors using the overlay data to thus provide feedback to the exposure device in hopes of preventing defects due to misalignment of pattern layers on the wafer being processed. Unfortunately, the conventional overlay measurement method and related apparatus suffer from several problems.

For example, the conventional overlay measurement method (e.g., one obtaining overlay data through the use of regression analysis applied to each overlay measurement applied to overlay marks formed on the wafer) suffers from yield rate problems due to the absence of overlay measurement data related to a first layer or a photoresist pattern (active layer) formed on the wafer in an initial state where an underlying pattern layer is yet to exist.

SUMMARY OF THE INVENTION

Therefore, embodiments of the invention provide an overlay measurement method adapted to increase or maximize production yield rate by obtaining overlay measurement data related to an initial photoresist pattern formed on the wafer even where no underlying pattern layer exists. Embodiments of the invention are also related to overlay marks adapted to the foregoing method embodiments.

For example, one embodiment of the invention provides an overlay measurement method, comprising; arranging a wafer on an exposure apparatus adapted to perform a process, identifying an overlay mark formed on the wafer, determining from the identified overlay mark whether or not the process is an initial process, and if the process is an initial process, calculating overlay measurement data using a first distance measurement, or if the process in not an initial process, calculating the overlay measurement data using a second distance measurement.

Another embodiment of the invention provides an overlay measurement method, comprising; arranging a wafer on an exposure apparatus adapted to perform a process, identifying an overlay mark formed on the wafer, determining from the identified overlay mark whether or not the process is an initial process, and if the process is an initial process, calculating overlay measurement data using a first distance measurement, wherein first distance measurement is made between a central position of the wafer and an overlay mark, or if the process in not an initial process, calculating the overlay measurement data using a second distance measurement, wherein the second distance measurement is made between one overlay mark formed on an existing layer and another overlay mark.

In yet another embodiment, the invention provides an overlay mark, comprising; a first overlay mark comprising a first inner mark and a first outer mark separately formed proximate an outer portion of a chip area on a wafer, and at least one second overlay mark comprising concentrically formed second inner mark and second outer mark having an identical center formed proximate an outer portion of the chip area.

BRIEF DESCRIPTION OF THE DRAWINGS

Exemplary embodiments of the invention are described below with reference to the attached drawings. The shape, relative size, and/or thickness of some drawing lines may be exaggerated to emphasize certain exemplary features of the embodiments. In the drawings, like numbers refer to like elements. The drawings include the following.

FIG. (FIG.) 1 is a flow chart illustrating an overlay measurement method according to an embodiment of the present invention.

DESCRIPTION OF EXEMPLARY EMBODIMENTS

Embodiments of the invention will now be described with reference to the accompanying drawings. These embodiments are presented as teaching examples. Other embodiments having different specific forms and/or construction are certainly possible and the subject invention should not be construed as being limited to only the embodiments set forth herein.

Figure 1:
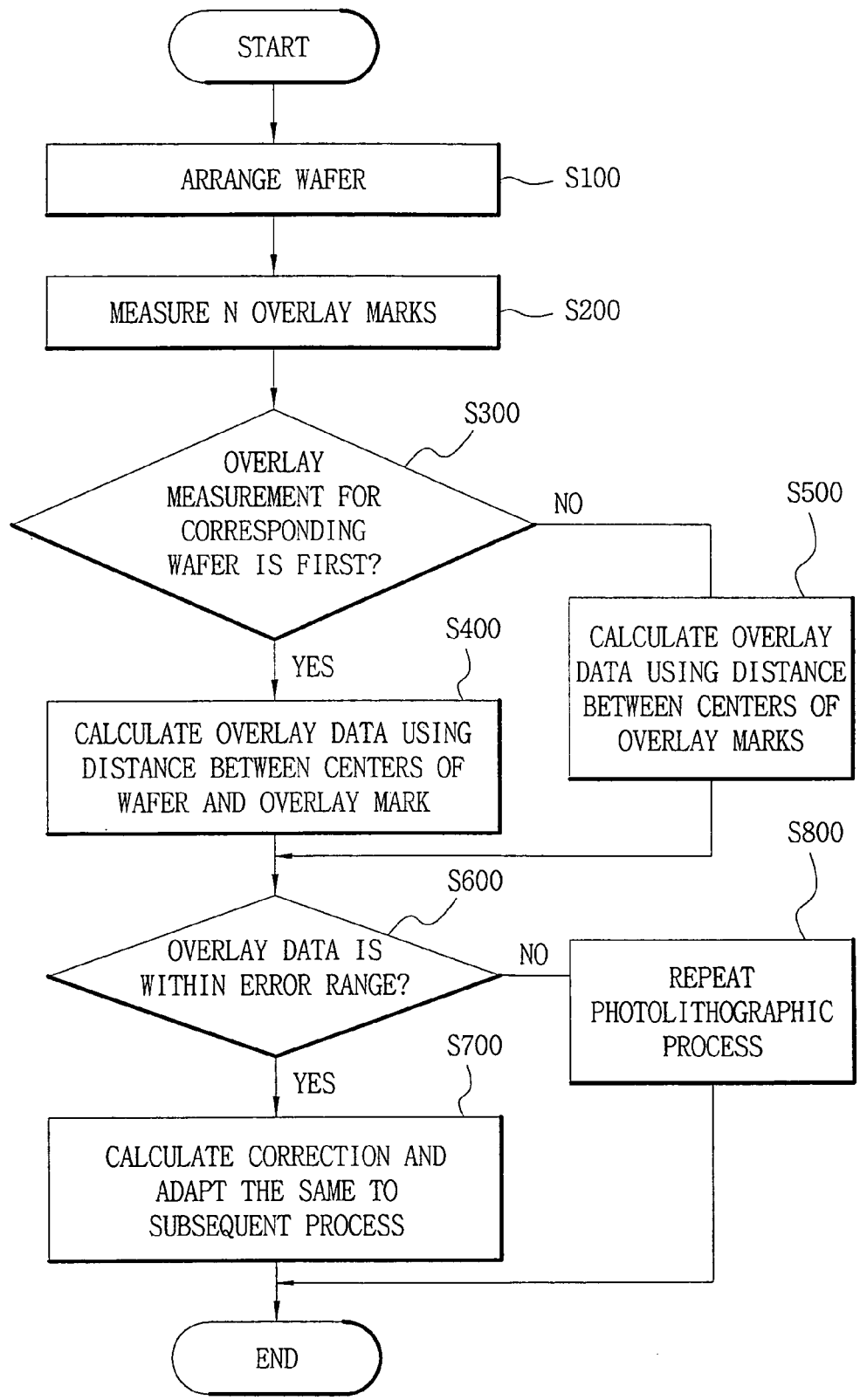

FIG. 1 is a flow chart illustrating one embodiment of an overlay measurement method. As described in the flowchart of FIG. 1, the overlay measurement method begins with the positioning or arrangement of a wafer W within (or in relation to) exposure equipment adapted to perform a photolithographic process (S100). In one embodiment, the wafer is arranged in a position dictated by a flat zone or a notch formed thereon. Once the wafer is properly positioned, the center position of the wafer W may be determined.

Then, a detection sampling process (e.g., an identifying process) is conducted in relation to a plurality (N) of overlay marks formed respectively in a plurality of regions on the wafer (S200). The overall efficiency of the overlay mark measurement process is a function of the number of regions to be examined. Hence, an overly large number of samples would adversely effect manufacturing productivity. It is, therefore, quite practical to randomly sample only a reduced number of the possible sample regions on the wafer. For example, in a case where the wafer is 30 inches in diameter, the overlay measurement process might be conducted between about 20 to about 40 times. In one specific embodiment, 29 overlay measurements are made on a 30 inch diameter wafer.

Next, a process is conducted to determine whether the current overlay measurement process is related to an initial (e.g.,) photolithography process (and hence a first overlay measurement process) performed on the subject wafer (S300). Stored process history data related to the previously performed fabrication processes for the wafer may be consulted for this purpose. For example, where the subject wafer has not previously been subjected to a photolithographic process, the process history data will not include any overlay measurement data. However, where a previous photolithographic process has been performed on the wafer, the process history data will contain overlay measurement data.

Accordingly, if the current photolithographic process is determined to be an initial photolithography process (S300=Yes), the overlay measurement data is calculated in relation to a first distance measured from a center position of the wafer W to the center of each respective overlay mark sampled (S400).

However, if the current photolithographic process is not the initial one (S300=No), the overlay measurement data may be calculated in relation to a second distance measured between the center of a respective overlay mark formed on the previously formed photoresist pattern (e.g., an alignment measurement pattern) and the center of a corresponding overlay mark formed on a pattern related to the current photolithographic process (e.g., a reference pattern) (S500).

If the calculated overlay measurement data, however derived, falls within a defined error range (e.g., within a defined manufacturing tolerance range) (S600=Yes), it will be possible to calculate a correction factor using the overlay measurement data and adjust the exposure equipment in the subsequent photolithographic process accordingly (S700).

However, if the overlay measurement data falls outside the defined error range (S600=No), the photolithographic process should be repeated (S800).

In this manner, method embodiments of the invention are able to increase or maximize production yield by calculating overlay measurement data using distance measurements alternately defined in relation to the center of the wafer, or the overlay marks (or overlay measurement data) from a previously formed photoresist pattern (e.g., an active layer or initial layer) formed on the wafer. Either set of overlay measurement data may be used to good effect in the correction of exposure equipment conditions related to the photolithographic process.

Figure 2:
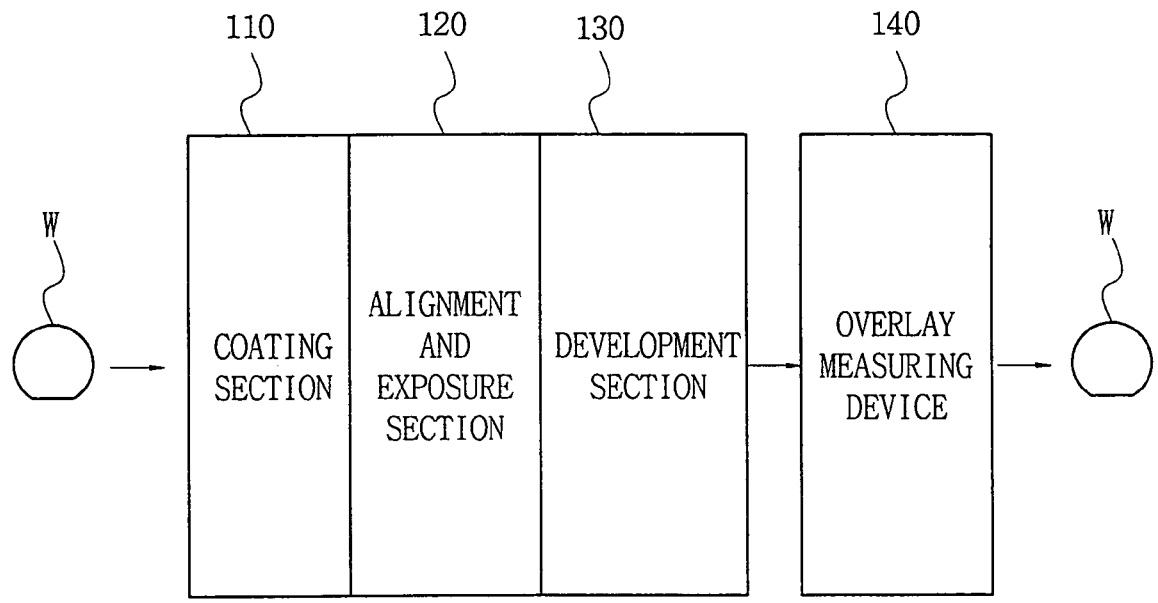
FIG. 2 is a schematic block diagram illustrating a procedure for equipment of implementing a photolithographic process.

FIG. 2 is a schematic block diagram illustrating an exemplary process adapted for use within the operation of equipment implementing a photolithographic process. First, a coating section 110 comprising a spinner conducts a cleaning step to remove moisture from the surface of a wafer W. Foreign substances (e.g., contaminants) are then removed from the surface of wafer W using (e.g.,) a free bake process, pressurized pure water and a brush. Such wafer preparation steps improve the adherence of the photoresist layer to be applied to the wafer surface. Then, a spin step uniformly coats the wafer with photoresist, and a soft bake step removes any volatilizing solvent from the photoresist layer in a curing process.

After successful processing in the coating section 110, wafer W is conveyed to an alignment and exposure section 120. This section conducts a free alignment step adapted to arrange a reticle and wafer W in relation to a reference mark of the stepper. An alignment step then fixes the wafer in a position defined by a flat zone on wafer W. The exposure step next determines exposure conditions and exposes the photoresist accordingly.

After successful alignment and exposure, wafer W is transferred to a development section 130 which conducts a post exposure step to remove any standing-wave effects. A development step is the performed to selectively removing a portion of the photoresist layer reacted (e.g.,) with UV light, and a hard bake step is performed to cure the resulting photoresist pattern remained on wafer W to the point where it will endure subsequently processing temperatures.

Once the photoresist pattern is successfully formed, wafer W is transferred to an overlay measuring device 140. Overlay measurement data is calculated for the photoresist pattern formed on wafer W using a method like the embodiment described above. That is, overlay measurement data is calculated on the basis of initial and non-initial photolithography processes in relation to wafer center position calculations or calculations related to a previously formed pattern. On the basis of a correction factor obtained from the foregoing overlay measurement data the operations performed by alignment and exposure section 120 may be further optimized in subsequent photolithography processes.

In sum, the overlay measurement process generally checks whether or not the photoresist pattern is accurately formed on wafer W. It is an essential process adapted to the prevention of defects caused by a misalignment between the patterned light derived from the reticle or photo-mask and the positioned wafer. Conventionally, such overlay measurements could not be accurately obtained for initial photolithography processes. Embodiments of the invention solve this problem by calculating overlay measurement data in relation to the center position of wafer W.

After successfully completing the overlay measurement process, an after develop inspection (ADI) process is typically conducted using scanning electron spectroscopy to inspect the photoresist pattern after development. A reflow process of the photoresist pattern may also be performed through a subsequent annealing step followed by an after flow inspection (AFI) process. Generally, overlay measurement data may be extracted in relation to measured distance(s) in the X and Y directions from a predetermined position (e.g., a center position) on wafer W to the center of each respective overlay mark. Alternatively or additionally measured distances in the X and Y directions may be defined in relation to an outer mark formed on an underlying pattern layer and an inner mark formed on an upper pattern layer among the alignment marks formed on wafer W. These measured distance values (or values derived there from) may be subjected to regression analysis using, for example, the equations that follow.

Figure 3:
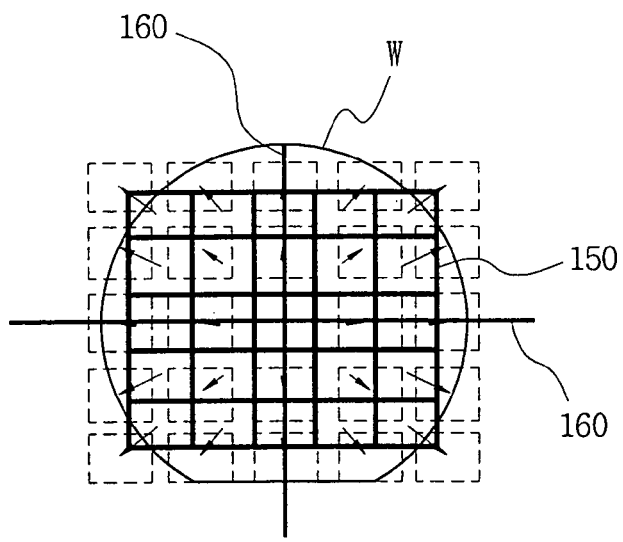
FIGS. 3 through 5 are plan views illustrating overlay data.
Figure 4:
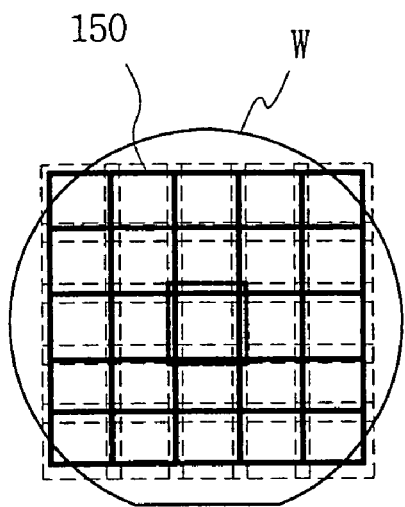
Figure 5:
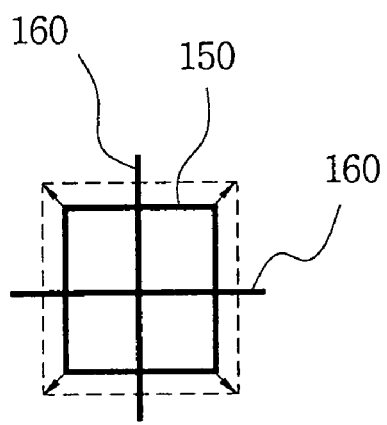

FIGS. 3 through 5 are plan views illustrating exemplary overlay measurement data and related overlay marks. As noted previously, the deviations in overlay measurement data may be classified into wafer related parameters and reticle related parameters. Wafer related parameters, as previously described, may be related to the expansion or contraction of wafer W in any one or more of the directions indicated by the arrows in FIG. 3. Various portions of a chip area 150 (e.g., the surface area portion on wafer W receiving some or all of a circuit pattern) may be geometrically distorted in relation to central lines 160 by the expansion or contraction of wafer W. Other wafer related parameters may be related to input errors to the stepper, expansion or contraction of the photoresist layer in the spinner, errant states for the alignment mark or defect in signal detection by the exposure equipment, etc. Additional wafer related parameters may be related to an offset component indicating a degree of overlay mark deviation (right to left, or up to down), a scaling component indicating a degree to which the pattern formed on wafer W is magnified right to left and up to down by a projection lens, a rotation component indicating a degree to which the center axis of the overlay mark is rotated and/or tilted relative to the center axis of wafer W, and an orthogonal component indicating a degree to which tilting occurs between the center axes of the corresponding overlay marks.

A defined constellation of wafer related parameter(s) may be expressed by the following regression analysis equations using 2D orthogonal coordinates system with X and Y components. The equations include:

$$dx = X\text{off} + X\text{sca}^*x - X\text{rot}^*y$$

$$dy = Y\text{off} + Y\text{sca}^*y - X\text{rot}^*x,$$

where Xoff, Xsca, and Xrot are constants indicating wafer offset, wafer scaling, and wafer rotation, respectively, in X direction, and Yoff, Ysca, and Yrot are constants indicating wafer offset, wafer scaling, and wafer rotation, respectively, in Y direction. In addition, a cumulative equation according to the measurement of the plural overlay marks may be converted as a sequence for each of variables x, y, dx, and dy.

Reticle related parameter may be related to enlarged or reduced state(s) in the magnification of the exposure light by the reticle relative a defined exposure point (e.g., a particular shot) based on variations in the exposure equipment conditions. See, e.g., the expansion or contraction directions indicated by the arrows shown in FIGS. 4 and 5 with respective to individual cells formed on the surface of wafer W. As can be seen, chip area 150 positioned at the center of the wafer W is expanded in the illustrated example in all directions relative to central lines 160. Of course, similar (or asymmetric) expansion or contraction may also take place in respective chip areas 150 through which the central lines 160 do not pass.

Other reticle related parameters may be related to the precision with which the exposure equipment optical system is aligned with wafer W in first and subsequent exposure processes, and other misalignments in the exposure equipment optical system, or defects in the overlay mark(s) or reticle, etc. Other reticle related parameters may relate to the degree to which a reticle reduction component improperly magnifies the patterned light passed to wafer W from the reticle (e.g., enlargement or reduction, up and down errors, and positioned error related to the exposure equipment). Still other reticle related parameters may be related to a rotation component indicating the degree to which the axis of an alignment pattern is tilted relative to a reference axis of an alignment pattern due to inaccurate setting of a corresponding reticle. A defined constellation of reticle related parameters may be expressed by the following regression analysis equations using 2D orthogonal coordinates system.

$$dx = X\text{red}^*x - X\text{rot}^*y$$

$$dy = Y\text{red}^*y - X\text{rot}^*x,$$

where Xred and Xrot are constants indicating reticle reduction and and reticle rotation, respectively, in X direction, and Yred and Yrot are constants indicating reticle reduction and reticle rotation, respectively, in Y direction. Similarly, a cumulative equation according to the measurement of the plural overlay marks may be converted as a sequence for each of variables x, y, dx, and dy.

Figure 6:
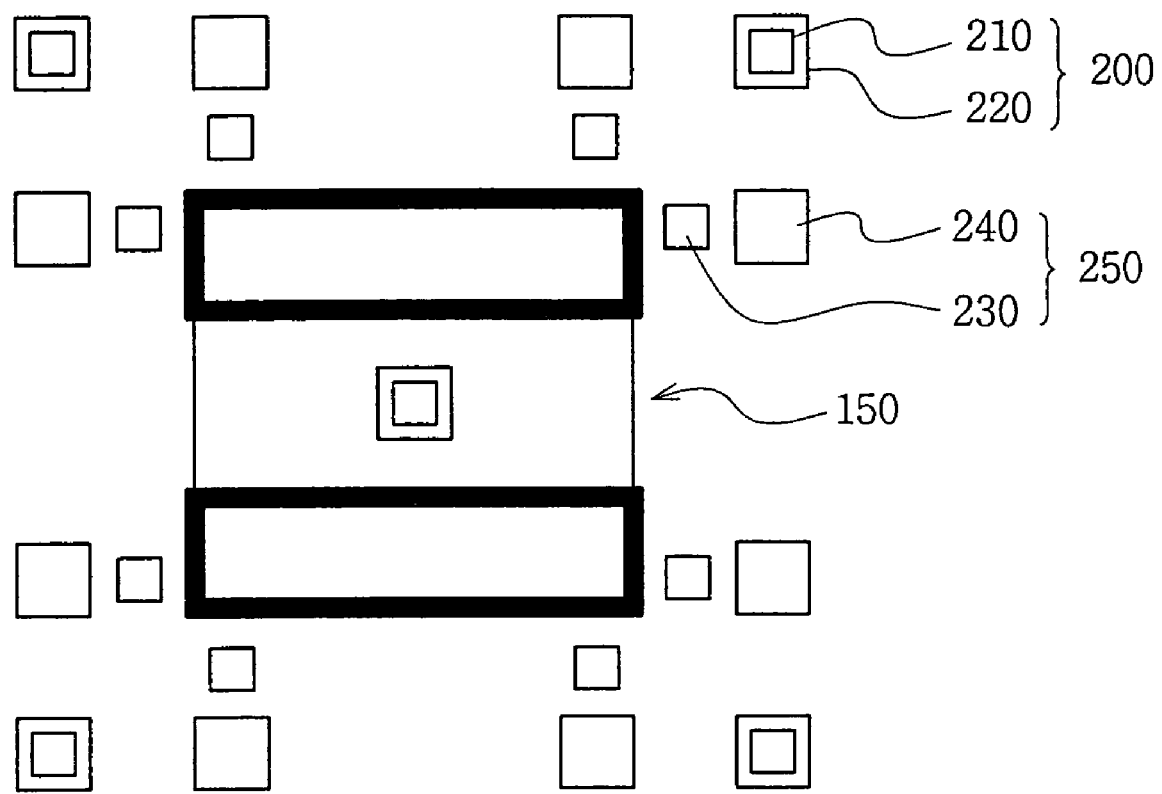
FIG. 6 is a plan view illustrating an overlay mark according to the present invention.

FIG. 6 is a plan view illustrating an exemplary overlay mark adapted for use in embodiments of the invention. The exemplary overlay mark comprises a first overlay mark 250 including a first inner mark 230 or a first outer mark 240 separately formed proximate a peripheral outer portion of chip area 150 formed on wafer W. The exemplary overlay mark further comprises a second overlay mark 200 including concentric second inner mark 210 and second outer mark 220 each having an identical center formed proximate a peripheral outer portion of chip area 150.

First overlay mark 250 may be used to obtain overlay measurement data in relation to distances measured between the constituent overlay marks formed on a photoresist pattern formed on an existing, underlying pattern layer and the upper portion of the underlying pattern layer.

In contrast, second overlay mark 200 may be used to obtain overlay measurement data measured in relation to the center of an overlay mark associated with an initial photoresist pattern formed on the bare wafer W where the underlying pattern layer does not exist.

That is, overlay measuring device 140 of FIG. 2 may be used to measure overlay of an underlying pattern layer where first inner mark 230 and the first outer mark 240 are formed, and measure overlay of the present photoresist pattern where the first outer mark 240 and the first inner mark 230 are formed exclusively to the underlying pattern layer, and then calculate the overlay measurement data using the distance between the centers of the first inner mark 230 and the first outer mark 240. In addition, in case where the photoresist pattern comprises second overlay mark 200 formed on the bare wafer W, the overlay measuring device 140 recognizes the second inner mark 210 and the second outer mark 220 whose centers are identical to each other to thus obtain measured distances and calculate the overlay measurement data using the distance between the centers of the second overlay mark 200 and the wafer W.

The second overlay mark 200 may be formed at any reasonable position (e.g., near a core ferry region between cell areas consisting of 4 banks) proximate of the chip area 150, such that distance measurements may be made between the centers of the second overlay mark 200 and the wafer W. Indeed, the second overlay mark 200 may readily be designed such that it is positioned at any place of the outer portion of the chip area 150.

Accordingly, the exemplary overlay mark enables the overlay measuring device 140 to calculate relevant overlay distances using the first overlay mark 250 consisting of existing inner mark or outer mark whose centers are not identical to each other, and the second overlay mark 200 consisting of the inner mark and outer mark whose centers having an identical center in relation to an initial photolithographic process performed on bare wafer W, thereby increasing or maximizing production yield rate.

As described before, the exemplary overlay measurement method is able to increase or maximize production yield rate through the calculation of overlay data using distance(s) between the centers of the wafer and the overlay mark upon overlay measurement of a photoresist pattern formed on the bare wafer W where an underlying pattern layer does not exist, and adapting the same to the subsequent photolithographic process.

The invention has been described in relation to exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. Therefore, the scope of the attached claims should be accorded the broadest interpretation so as to encompass all such modifications and similar arrangements.

What is claimed is:

1. An overlay measurement method, comprising:
arranging a wafer on an exposure apparatus adapted to perform a process;
identifying an overlay mark formed on the wafer;
determining whether or not the process is an initial process;
if the process is an initial process, calculating overlay measurement data using a first distance measurement; and
if the process is not an initial process, calculating the overlay measurement data using a second distance measurement.

2. The overlay measurement method of claim 1, wherein first distance measurement is made between a central position of the wafer and an overlay mark.

3. The overlay measurement method of claim 1, wherein the second distance measurement is made between one overlay mark formed on an existing layer and another overlay mark.

4. The overlay measurement method of claim 1, wherein the wafer has a diameter of 30 inches, and the overlay measurement is conducted 29 times.

5. The overlay measurement method of claim 1, further comprising:
referencing process history data stored in relation to the exposure apparatus.

6. The overlay measurement method of claim 2, wherein calculating the overlay measurement data comprising:
measuring a distance between the respective centers of a plurality of overlay marks.

7. The overlay measurement method of claim 1, further comprising:
calculating a correction factor using the overlay measurement data and providing a feedback signal to the exposure equipment indicative of the correction factor.

8. The overlay measurement method of claim 7, wherein calculating a correction factor using the overlay measurement data only proceeds wherein the first measurement distance or the second measurement distance fall within a defined error range.

9. The overlay measurement method of claim 1, further comprising:
repeating the process wherein the first measurement distance or the second measurement distance fall outside a defined error range.

10. An overlay measurement method, comprising:
arranging a wafer on an exposure apparatus adapted to perform a process;
identifying an overlay mark formed on the wafer;
determining whether or not the process is an initial process;
if the process is an initial process, calculating overlay measurement data using a first distance measurement, wherein the first distance measurement is made between a central position of the wafer and the overlay mark; and
if the process is not an initial process, calculating the overlay measurement data using a second distance measurement, wherein the second distance measurement is made between one overlay mark formed on an existing layer and another overlay mark.

11. The overlay measurement method of claim 10, wherein the central position of the wafer is measured during arranging the wafer.

12. The overlay measurement method of claim 10, wherein the wafer has a diameter of 30 inches, and the overlay measurement method is repeated between about 20 to about 40 times.

13. The overlay measurement method of claim 10, further comprising:
referencing process history data stored in relation to the exposure apparatus.

14. The overlay measurement method of claim 10, wherein calculating the overlay measurement data comprising:
measuring a distance between the respective centers of a plurality of overlay marks.

15. The overlay measurement method of claim 10, further comprising:
calculating a correction factor using the overlay measurement data and providing a feedback signal to the exposure equipment indicative of the correction factor.

* * * * *